(12) United States Patent
Feler et al.

(10) Patent No.: US 10,824,082 B2
(45) Date of Patent: Nov. 3, 2020

(54) ESTIMATION OF ASYMMETRIC ABERRATIONS

(71) Applicant: KLA-TENCOR CORPORATION, Milpitas, CA (US)

(72) Inventors: Yoel Feler, Haifa (IL); Vladimir Levinski, Migdal HaEmek (IL)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 16/305,629

(22) PCT Filed: Oct. 30, 2018

(86) PCT No.: PCT/US2018/058068
§ 371 (c)(1),
(2) Date: Nov. 29, 2018

(87) PCT Pub. No.: WO2020/091733
PCT Pub. Date: May 7, 2020

(65) Prior Publication Data
US 2020/0133135 A1 Apr. 30, 2020

(51) Int. Cl.
*G03F 7/20* (2006.01)
*G03F 9/00* (2006.01)
(Continued)

(52) U.S. Cl.
CPC ..... *G03F 7/70683* (2013.01); *G01N 21/9501* (2013.01); *G01N 21/95607* (2013.01);
(Continued)

(58) Field of Classification Search
CPC ............... G01N 21/93; G01N 21/9501; G01N 21/95607; G03F 7/706; G03F 7/70616;
(Continued)

(56) References Cited

U.S. PATENT DOCUMENTS 5,790,254 A * 8/1998 Ausschnitt .......... G03F 7/70633
356/603
7,608,468 B1 10/2009 Ghinovker et al.
(Continued)

FOREIGN PATENT DOCUMENTS

WO 2015090839 A1 6/2015

OTHER PUBLICATIONS

WIPO, ISR for PCT/US2018/058068, Jul. 19, 2019.

*Primary Examiner* — Colin W Kreutzer
(74) *Attorney, Agent, or Firm* — Hodgson Russ LLP

(57) ABSTRACT

Metrology targets, target design methods and menology measurement methods are provided, which estimate the effects of asymmetric aberrations, independently or in conjunction with metrology overlay estimations. Targets comprise one or more pairs of segmented periodic structures having a same coarse pitch, a same 1:1 line to space ratio and segmented into fine elements at a same fine pitch, wherein the segmented periodic structures differ from each other in that one thereof lacks at least one of its corresponding fine elements and/or in that one thereof comprises two groups of the fine elements which are separated from each other by a multiple of the fine pitch. The missing element(s) and/or central gap enable deriving the estimation of aberration effects from measurements of the corresponding segmented periodic structures. The fine pitches may be selected to correspond to the device fine pitches in the corresponding layer.

20 Claims, 3 Drawing Sheets

(51) Int. Cl.
*G01N 21/956* (2006.01)
*G01N 21/95* (2006.01)

(52) U.S. Cl.
CPC .......... *G03F 7/706* (2013.01); *G03F 7/70616* (2013.01); *G03F 7/70633* (2013.01); *G03F 9/7076* (2013.01)

(58) Field of Classification Search
CPC ............. G03F 7/70625; G03F 7/70633; G03F 7/70683; G03F 9/7073; G03F 9/7076
USPC ............... 355/68, 77; 356/399–401; 382/287
See application file for complete search history.

(56) References Cited

U.S. PATENT DOCUMENTS

| | | | |
|---|---|---|---|
| 9,476,838 B2 | 10/2016 | Choi et al. | |
| 2005/0156334 A1* | 7/2005 | Froebel | G03F 9/7049 257/797 |
| 2007/0105029 A1* | 5/2007 | Ausschnitt | B81C 99/0065 430/30 |
| 2013/0107259 A1 | 5/2013 | Choi et al. | |
| 2015/0233705 A1 | 8/2015 | Bringoltz et al. | |
| 2017/0023358 A1 | 1/2017 | Lee et al. | |
| 2019/0250504 A1 | 8/2019 | Feler et al. | |

\* cited by examiner

ESTIMATION OF ASYMMETRIC ABERRATIONS

BACKGROUND OF THE INVENTION

1. Technical Field

The present invention relates to the field of semiconductor metrology, and more particularly, to estimating and reducing asymmetric aberrations.

2. Discussion of Related Art

Metrology measurements utilize a range of targets for measuring various metrology metrics, such as the overlay between target layers. Various aberrations affect the printing accuracy of the semiconductor devices and the measurement accuracy of the metrology targets.

SUMMARY OF THE INVENTION

The following is a simplified summary providing an initial understanding of the invention. The summary does not necessarily identify key elements nor limit the scope of the invention, but merely serves as an introduction to the following description.

One aspect of the present invention provides a metrology target comprising at least two segmented periodic structures having a same coarse pitch, a same line to space (L:S) ratio of 1:1 and are segmented into fine elements at a same fine pitch, wherein the segmented periodic structures differ from each other in that one thereof lacks at least one of its corresponding fine elements and/or in that one thereof comprises two groups of the fine elements which are separated from each other by a multiple of the fine pitch.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings.

DETAILED DESCRIPTION OF THE INVENTION

Figure 1:
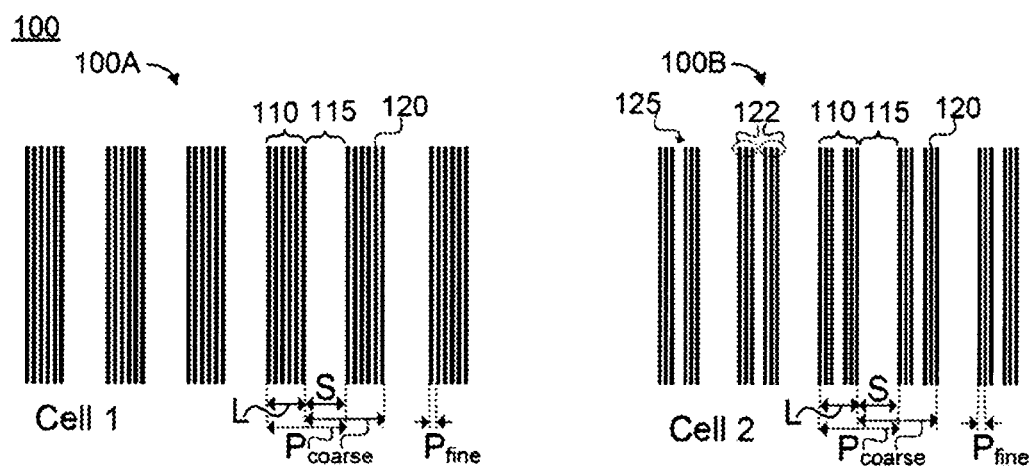
FIGS. 1 and 2 are high-level schematic illustrations of metrology targets or parts thereof, according to some embodiments of the invention.

In the following description, various aspects of the present invention are described. For purposes of explanation, specific configurations and details are set forth in order to provide a thorough understanding of the present invention. However, it will also be apparent to one skilled in the art that the present invention may be practiced without the specific details presented herein. Furthermore, well known features may have been omitted or simplified in order not to obscure the present invention. With specific reference to the drawings, it is stressed that the particulars shown are by way of example and for purposes of illustrative discussion of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments that may be practiced or carried out in various ways as well as to combinations of the disclosed embodiments. Also, it is to be understood that the phraseology and terminology employed herein are for the purpose of description and should not be regarded as limiting.

Unless specifically stated otherwise, as apparent from the following discussions, it is appreciated that throughout the specification discussions utilizing terms such as "processing", "computing", "calculating", "determining", "enhancing", "deriving" or the like, refer to the action and/or processes of a computer or computing system, or similar electronic computing device, that manipulates and/or transforms data represented as physical, such as electronic, quantities within the computing system's registers and/or memories into other data similarly represented as physical quantities within the computing system's memories, registers or other such information storage, transmission or display devices. In certain embodiments, illumination technology may comprise, electromagnetic radiation in the visual range, ultraviolet or even shorter wave radiation such as x rays, and possibly even particle beams.

Embodiments of the present invention provide efficient and economical methods and mechanisms for estimating the effects of asymmetric aberrations in a photolithography process or system and thereby provide improvements to the technological field of semiconductor metrology. Metrology targets, target design methods and metrology measurement methods are provided, which estimate the effects of asymmetric aberrations, independently or in conjunction with metrology overlay estimations. Targets comprise one or more pairs of segmented periodic structures having a same coarse pitch, a same 1:1 line to space ratio and segmented into fine elements at a same fine pitch, wherein the segmented periodic structures differ from each other in that one thereof lacks at least one of its corresponding fine elements and/or in that one thereof comprises two groups of the fine elements which are separated from each other by an integer multiple of the fine pitch. The missing element(s) and/or central gap enable deriving the estimation of aberration effects from measurements of the corresponding segmented periodic structures. The fine pitches may be selected to correspond to the device fine pitches in the corresponding layer.

Figure 2:
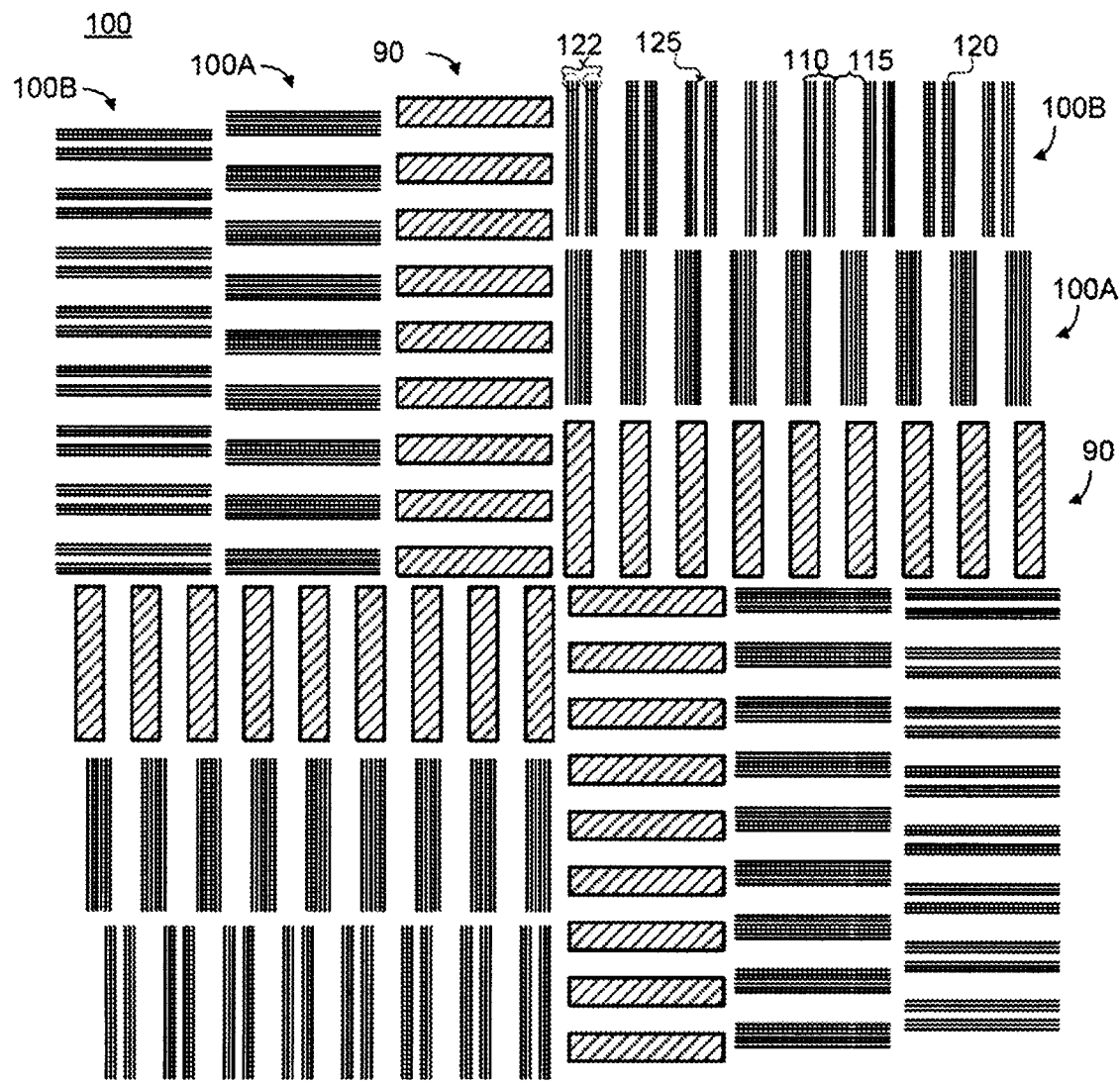

FIGS. 1 and 2 are high-level schematic illustrations of metrology targets 100 or parts thereof, according to some embodiments of the invention. FIG. 1 illustrates schematically two target cells with corresponding periodic structures 100A, 100B, which may be used as independent target 100 or as part of targets 100 with more elaborate design, such as illustrated schematically in FIG. 2. FIG. 2 illustrates schematically target 100 with two measurement directions, having pairs of cells with corresponding periodic structures 100A, 100B long each measurement direction as well as additional periodic structures 90, as explained below.

Metrology targets 100 comprise at least two segmented periodic structures 100A, 100B having a same coarse pitch (denoted $P_{coarse}$ with respect to elements 110 in FIG. 1), a same line to space (L:S, relating to the dimensions of elements 110 and spaces 115 therebetween) ratio of 1:1 and are segmented into fine elements 120 at a same fine pitch (denoted $P_{fine}$ in FIG. 1). Segmented periodic structures 100A, 100B differ from each other in that one thereof (100B in FIG. 1) lacks at least one of its corresponding fine elements, denoted schematically in FIG. 1 as missing element(s), forming gap 125. The inventors have found out that gap 125 of missing one or more central element enhances the sensitivity of the measured shift of the first harmonics to the scanner asymmetric aberrations. Gap 125 may comprise a multiple number of fine pitches, when measured, e.g., between the centers of the lines (fine elements 120) on its sides. Disclosed targets 100, and specifically segmented periodic structures 100A, 100B may be used to provide the estimation of PPE (pattern placement error) for each target cell and enable correction of the measured overlay and possibly estimation of the aberration amplitude (using, e.g., the derivation disclosed in U.S. patent application Publication Ser. No. 15/776,588, incorporated herein by reference in its entirety).

For example, missing fine element(s) 125 may be central with respect to the elements of corresponding periodic structure 100B. The inventors note that the central elements provide the main impact to the target contrast whereas the end elements (on the sides of each element) contribute to the main CD variability impact. Accordingly, targets without the central elements become more sensitive to scanner aberrations and grating positions shift between regular target elements 100A and calibration targets 100B and provides the error correction or errors caused by scanner aberrations. Segmented periodic structures 100A, 100B may be configured to have similar CD variation values since on the mask there are assist features (which are not printed) but provide the similar distribution of the light in scanner pupil as for the regular target. The same reason (the similar distribution of the light in the scanner pupil) leads to the target design which is based on the same fine pitch which also should be equal to the device pitch in order to get the corrected target position as much as possible to the position of device.

In certain embodiments, segmented periodic structure 100B may comprise two (or possibly more) groups 122 of fine elements 120 which are segmented at the same fine pitch ($P_{fine}$) and are separated from each other by a whole (integer) multiple of $P_{fine}$, e.g., an odd multiple of $P_{fine}$ if an even number of lines (fine elements 120) is removed to form gap 125 and an even multiple of $P_{fine}$ if an odd number of lines (fine elements 120) is removed to form gap 125.

In various embodiments, disclosed targets 100 have designs which are close to the device designs, e.g., in their fine pitches, and are sensitive to asymmetric aberrations. Disclosed designs may be a part of regular overlay targets or be designed as a separate target. The simultaneous placement of two or more segmented periodic structures 100A, 100B (e.g., gratings) having different sensitivities of the measured signal shift to the scanner asymmetric aberrations, in the same layer, may be used to provide the estimations of the effects asymmetric aberrations have on the devices. Specifically, the inventors have found that using the 1:1 Line:Space ratio enhances the sensitivity of the shift of the first harmonics of the image (the signal collected using an imaging tool). Special OPC (Optical proximity correction) strategies (as disclosed, e.g., in U.S. patent application Publication Ser. No. 15/776,588, incorporated herein by reference in its entirety) may further be applied to enhance the aberration sensitivity of the mask design of targets 100.

At least two segmented periodic structures 100A, 100B may comprise one pair of segmented periodic structures 100A, 100B as illustrated schematically in FIG. 1, or two or more pairs of segmented periodic structures 100A, 100B which differ in one or more fine element, and/or in the configurations or arrangement of fine elements 120 thereof. In certain embodiments, one or more central elements may be removed from one of segmented periodic structures 100A, 100B, maintaining the resulting segmented structure with central symmetry and gaps 125 having widths of a whole number of fine pitches.

In various embodiments, one or more fine element may provide the difference between segmented periodic structures 100A, 100B, e.g., one central fine element may be missing from one of the structures, two or more fine elements may be missing, or a location of missing fine element 125 may be different between segmented periodic structure 100A, 100B, e.g., missing element 125 may be central in one of the structures and a lateral one in the other structure. In certain embodiments, one or more pairs of segmented periodic structures 100A, 100B disclosed herein may be replaced by triplets (or possibly quadruplets or groupings of five or more) of segmented periodic structures, all having the same coarse pitch, a same L:S ratio of 1:1 and segmented into fine elements 120 with the same fine pitch, with different missing elements, or gaps 125 among the member segmented periodic structures of each triplet or other grouping.

In various embodiments, multiple segmented periodic structures 100A, 100B may be part of targets 100, e.g., three, four or more segmented periodic structures which may have different fine pitches (e.g., two pairs of segmented periodic structures 100A, 100B with different fine pitches) and/or may have missing elements, or gaps 125, at different positions in elements 110 (e.g., central or aside from the center of elements 110 or a different number of missing elements, or gaps 125, e.g., 1, 2 or 3 missing elements from respective segmented periodic structures 100B.

For example, in case different pitches are designed in the same device layer, e.g. 90 nm and 130 nm, metrology targets 100 may comprise one pair of segmented periodic. structures 100A, 100B with $P_{fine}$=130 nm and another pair of segmented periodic structures 100A, 100B with $P_{fine}$=90 nm—to provide aberration estimations for both pitches. In certain embodiments, targets 100 may comprise at least one pair of segmented periodic structures 100A, 100B for each fine pitch used in the device design, for one or multiple, possibly all layers.

In the example illustrated in FIG. 2, the inner and middle periodic structures 90, 100A, respectively, are used for regular overlay measurements and the middle and outer periodic structures 100A, 100B are used for aberration estimation as disclosed herein.

In certain embodiments, target 100 may comprise a number of pairs of segmented periodic structures 100A, 100B as the number of different sources of asymmetric aberrations (which are known to, be significant in a given lithography scanner system and/or a related photolithography process)—to recover the whole aberration content. When the latter are more numerous than the available target real estate, the pairs of segmented periodic structures 100A, 100B in targets 100 may be selected to provide a set of asymmetric aberrations which can be used to compensate the existing aberration for the specific pitches which were used in the targets resulting in estimations of the asymmetric aberrations which correspond to the impact of the aberrations on the actual device, yielding effective compensation without exact estimation of the actual full asymmetric aberration content. In certain embodiments therefore, target 100 may comprise a number of pairs of segmented periodic structures 100A, 100B as the number of different pitches in the device design (e.g., per layer).

Measurements of metrology targets 100 may be carried out by various microscopic technologies, e.g., by metrology imaging technologies, and may include learning stages, by simulation or by applying initial measurements, possibly implementing machine learning algorithms in the learning stages, before implementation in the production line.

Figure 3:
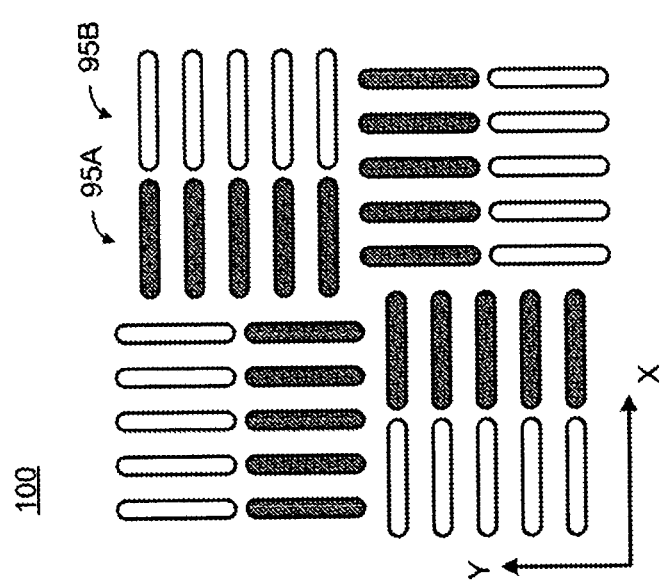
FIG. 3 is a high-level schematic illustration of metrology targets, according to some embodiments of the invention.

FIG. 3 is a high-level schematic illustration of metrology targets 100, according to some embodiments of the invention. The schematic example illustrates target 100 with pairs of periodic structures (denoted 95A, 95B) in the same or in two layers along two measurement directions (denoted X and Y)—configured to provide estimations of overlays or other metrology metrics with respect to layers 95A, 95B and measurement directions X, Y. Periodic structures 95A, 95B may be designed as disclosed segmented periodic structures 100A, 100B in one layer, or either periodic structure 95A, 95B may be replaced or augmented by disclosed two or more segmented periodic structures 100A, 100B configured to provide asymmetric aberration estimation in addition to the overlay estimation. Monitoring and correcting for the impacts of asymmetric aberrations may be provided by segmented periodic structures 100A, 100B as explained above, separated into measurement directions X, Y.

In certain embodiments, training stage(s) may be used to relate the measurements of disclosed segmented periodic structures 100A, 100B to one or more different asymmetric aberration sources (e.g., using one or two wafers with large induced aberrations). In certain embodiments, detailed analysis of asymmetric aberration sources may be carried out, e.g., using Zernike polynomials as disclosed in U.S. patent application Publication Ser. No. 15/287,388, incorporated herein by reference in its entirety, using multiple target 100, possibly with multiple pairs or multiples of segmented periodic structures 100A, 100B which differ in their present and missing segmented elements 120, 125, respectively, and possibly using elaborate simulations (e.g., metadynamic and/or full electromagnetic simulations).

Figure 4A:
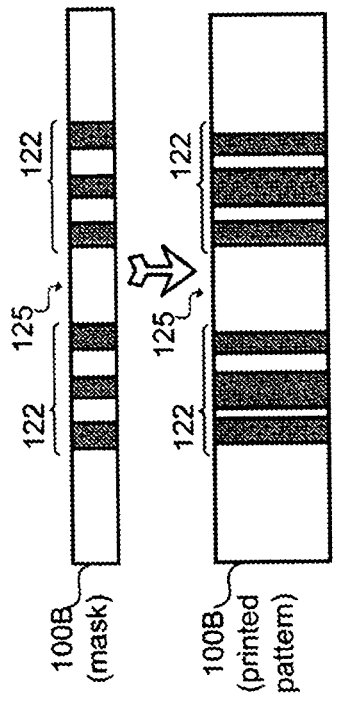
FIGS. 4A and 4B are high-level schematic illustrations of segmented periodic structures—with and without missing element(s), respectively, according to some embodiments of the invention.
Figure 4B:
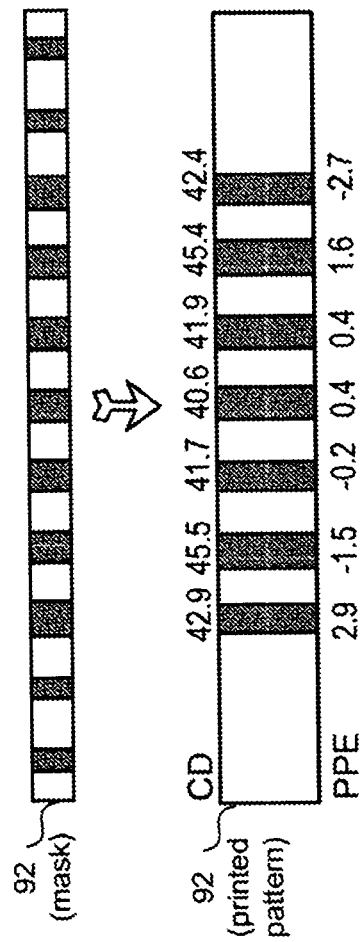

FIGS. 4A and 4B are high-level schematic illustrations of segmented periodic structures 100B, 92—with and without missing element(s) 125, respectively, according to some embodiments of the invention. Segmented periodic structures 100B, 92 are illustrated as designed on the mask and as printed on the wafer, with 10 mλ coma as a non-limiting example for an asymmetric aberration. The effects of the asymmetric aberration on segmented periodic structure 92 (without missing element 125) are indicated by the CD (critical dimension) and PPE (pattern placement error) values, resulting in $\Delta CD=0.5$ nm and measured mis-registration=0.7 nm. The effects of the asymmetric aberration on segmented periodic structure 100B with missing element 125 are significantly enhanced and reach, in the illustrated case, $\Delta CD=3.8$ nm and measured mis-registration=8.15 nm. Such enhancement may be used to provide a sensitive estimation of asymmetric aberrations.

Figure 5:
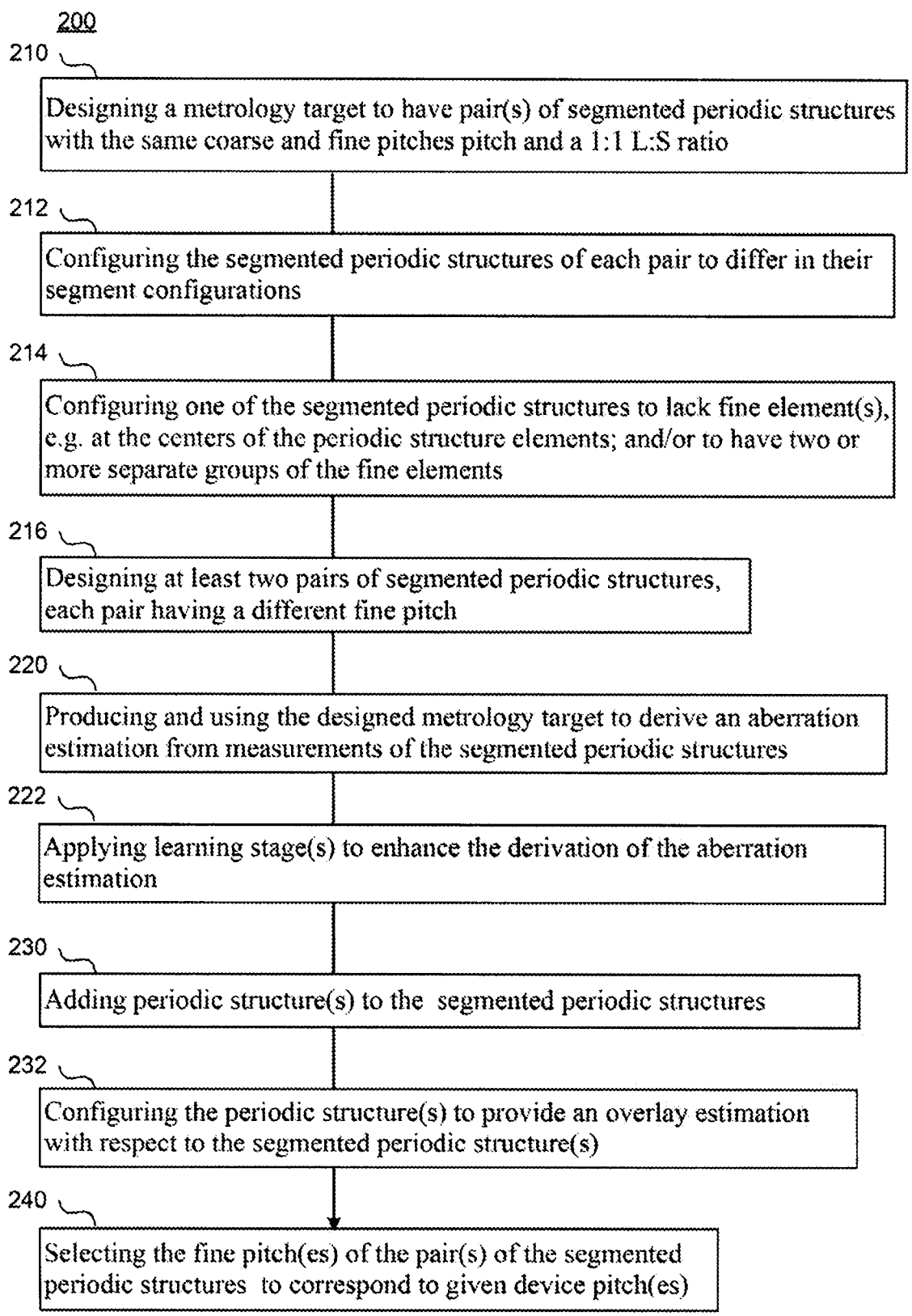
FIG. 5 is a high-level flowchart illustrating a method, according to some embodiments of the invention.

FIG. 5 is a high-level flowchart illustrating a method 200, according to some embodiments of the invention. The method stages may be carried out with respect to metrology targets 100 described above, which may optionally be configured to implement method 200. Method 200 may be at least partially implemented by at least one computer processor, e.g., in a metrology module. Certain embodiments comprise computer program products comprising a computer readable storage medium having computer readable program embodied therewith and configured to carry out the relevant stages of method 200. Certain embodiments comprise target design files of respective targets designed by embodiments of method 200 as well as metrology measurements of targets 100 and/or metrology measurements that are carried out using stages of method 200. Method 200 may comprise the following stages, irrespective of their order.

Method 200 comprises designing a metrology target to comprise at least two segmented periodic structures having a same coarse pitch, a same line to space (L:S) ratio of 1:1 and are segmented into fine elements at a same fine pitch (stage 210), and configuring the segmented periodic structures to differ from each other in their segment configurations (stage 212), e.g., with one of the segmented periodic structures lacking at least one of its corresponding fine elements (stage 214), e.g., the lacking fine element(s) may be central with respect to the corresponding elements of the corresponding periodic structure; and/or in that one thereof comprises two groups of the fine elements which are separated from each other by an integer number of of the fine pitch. Method 200 may comprise designing at least two pairs of segmented periodic structures, each pair having a different fine pitch (stage 216).

Method 200 may further comprise producing and using the designed metrology target to derive an aberration estimation from measurements of the at least two segmented periodic structures (stage 220). Certain embodiments further comprise applying learning stage(s) such as using simulation(s) or actual measurement(s), e.g., to provide initial approximations or to implement machine learning algorithms to enhance the derivation of the aberration estimations (stage 222).

In some embodiments, method 200 may further comprise adding at least one periodic structure to the at least two segmented periodic structures (stage 230), and configuring the at least one periodic structure to provide an overlay estimation from measurements thereof with respect to at least one of the segmented periodic structures (stage 232).

Method 200 may further comprise selecting the fine pitch, or multiple fine pitches in case of multiple pairs of segmented periodic structures, to correspond to given device pitch(es) (stage 240).

In certain embodiments, segmented periodic structures 100A, 100B with the same coarse pitch, 1:1 L:S ratio and same fine pitch, which differ from each other in missing element(s), or gap(s) 125 may be implemented using target structures disclosed in U.S. patent application Publication Ser. No. 15/776,588, incorporated herein by reference in its entirety, teaching the addition of sub-resolved assist features at a same periodicity as, and in continuation of, periodic structure(s) in the target's mask design, with the sub-resolved assist features having a CD that is smaller than a corresponding printability threshold. Target designs disclosed therein may be used in the context of the present disclosure to provide the measurements of the scanner asymmetric aberrations.

Disclosed embodiments provide solutions that handle the significant impact of asymmetric scanner aberrations on the overlay error budget. Since the effects of asymmetric aberration on different structures may be different, the pattern placement shifts of printed targets may be different, which makes their measurement in the prior art complicated (e.g., using a complicated calibration procedure per scanner\target) as they relate to both the device shifts due to the aberrations and to the difference between metrology target shifts with respect to the device design, as discussed in U.S. patent application Publication Ser. No. 15/776,588, incorporated herein by reference in its entirety.

Advantageously, disclosed embodiments provide a simpler solution for estimating asymmetric aberrations using target structures which have the same segmentation pitch as the device pitch (so that they are affected by the same aberrations as the devices are) but have an additional mechanism to provide estimations of the effects of the aberrations and their impact of the overlay measurement). Specifically, disclosed embodiments provide imaging-based estimations of asymmetric aberration impact, that may be designed specifically per customer periodic structures, on-product scanner aberration impact measurement procedures, targets which are highly sensitive to scanner asymmetric aberrations, targets that can measure overlay and aberrations at the same time, as well as targets and measurement methods which provide measurements of the aberration equivalents per device design.

Aspects of the present invention are described above with reference to flowchart illustrations and/or portion diagrams of methods, apparatus (systems) and computer program products according to embodiments of the invention. It will be understood that each portion of the flowchart illustrations and/or portion diagrams, and combinations of portions in the flowchart illustrations and/or portion diagrams, can be implemented by computer program instructions. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or portion diagram or portions thereof.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or portion diagram or portions thereof.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or portion diagram or portions thereof.

The aforementioned flowchart and diagrams illustrate the architecture, functionality, and operation of possible implementations of systems, methods and computer program products according to various embodiments of the present invention. In this regard, each portion in the flowchart or portion diagrams may represent a module, segment, or portion of code, which comprises one or more executable instructions for implementing the specified logical function(s). It should also be noted that, in some alternative implementations, the functions noted in the portion may occur out of the order noted in the figures. For example, two portions shown in succession may, in fact, be executed substantially concurrently, or the portions may sometimes be executed in the reverse order, depending upon the functionality involved. It will also be noted that each portion of the portion diagrams and/or flowchart illustration, and combinations of portions in the portion diagrams and/or flowchart illustration, can be implemented by special purpose hardware-based systems that perform the specified functions or acts, or combinations of special purpose hardware and computer instructions.

In the above description, an embodiment is an example or implementation of the invention. The various appearances of "one embodiment", "an embodiment", "certain embodiments" or "some embodiments" do not necessarily all refer to the same embodiments. Although various features of the invention may be described in the context of a single embodiment, the features may also be provided separately or in any suitable combination. Conversely, although the invention ma be described herein in the context of separate embodiments for clarity, the invention may also be implemented in a single embodiment. Certain embodiments of the invention may include features from different embodiments disclosed above, and certain embodiments may incorporate elements from other embodiments disclosed above. The disclosure of elements of the invention in the context of a specific embodiment is not to be taken as limiting their use in the specific embodiment alone. Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described. Meanings of technical and scientific terms used herein are to be commonly understood as by one of ordinary skill in the art to which the invention belongs, unless otherwise defined. While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

What is claimed is:

1. A metrology target comprising at least two segmented periodic structures having a same coarse pitch, a same line to space (L:S) ratio of 1:1 and that are segmented into fine elements at a same fine pitch, wherein the segmented periodic structures differ from each other in that one thereof lacks at least one of its corresponding fine elements while maintaining the same L:S ratio or one thereof comprises two groups of the fine elements which are separated from each other by an integer multiple of the fine pitch while maintaining the same L:S ratio.

2. The metrology target of claim 1 wherein the segmented periodic structures differ from each other in that one thereof comprises two groups of the fine elements which are separated from each other by the integer multiple of the fine pitch.

3. The metrology target of claim 1, wherein the segmented periodic structures are in a same target layer.

4. The metrology target of claim 1, wherein the segmented periodic structures comprise at least two pairs of the segmented periodic structures, each pair having a different fine pitch.

5. The metrology target of claim 4, wherein a number of the pairs of the segmented periodic structures is selected to equal a number of specified sources for asymmetric aberrations in a related photolithography process.

6. The metrology target of claim 4, wherein a number of the pairs of the segmented periodic structures is selected to equal a number of device pitches in a given device design.

7. The metrology target of claim 1, further comprising at least one periodic structure configured to yield overlay measurements with respect to at least one of the segmented periodic structures.

8. A computer program product comprising a non-transitory computer readable storage medium having computer readable program embodied therewith, the computer readable program including a target design file of the metrology target of claim 1.

9. The metrology target of claim 1, wherein the segmented periodic structures differ from each other in that one thereof lacks at least one of its corresponding fine elements.

10. The metrology target of claim 9, wherein the lack of the at least one fine element is central with respect to elements of a corresponding periodic structure.

11. A method comprising:
designing a metrology target to comprise at least two segmented periodic structures having a same coarse pitch, a same line to space (L:S) ratio of 1:1 and that are segmented into fine elements at a same fine pitch, and
configuring the segmented periodic structures to differ from each other in that one thereof lacks at least one of its corresponding fine elements while maintaining the same L:S ratio, or in that one thereof comprises two groups of the fine elements which are separated from each other by an integer multiple of the fine pitch while maintaining the same L:S ratio,
wherein the designing and/or the configuring are carried out by at least one computer processor.

12. The method of claim 11, wherein the segmented periodic structures differ from each other in that one thereof lacks at least one of its corresponding fine elements, and wherein the lack of the at least one fine element is central with respect to elements of the corresponding periodic structure.

13. The method of claim 11, further comprising producing and using the metrology target to derive an aberration estimation from measurements of the at least two segmented periodic structures.

14. The method of claim 11, further comprising adding at least one periodic structure to the at least two segmented periodic structures, and configuring the at least one periodic structure to provide an overlay estimation from measurements thereof with respect to at least one of the segmented periodic structures.

15. The method of claim 11, further comprising selecting the fine pitch to correspond to a given device pitch.

16. The method of claim 11, further comprising designing at least two pairs of segmented periodic structures, each pair having a different fine pitch.

17. The method of claim 16, further comprising selecting the fine pitches to correspond to given device pitches.

18. A computer program product comprising a non-transitory computer readable storage medium having computer readable program embodied therewith, the computer readable program configured to carry out the method of claim 11.

19. A metrology module comprising the computer program product of claim 18.

20. The method of claim 11, wherein the segmented periodic structures differ from each other in that one thereof comprises two groups of the fine elements which are separated from each other by the integer multiple of the fine pitch.

* * * * *